(12) United States Patent
Clampitt et al.

(10) Patent No.: US 6,204,114 B1
(45) Date of Patent: Mar. 20, 2001

(54) METHOD OF MAKING HIGH DENSITY SEMICONDUCTOR MEMORY

(75) Inventors: Darwin A. Clampitt, Boise; James E. Green, Caldwell, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/318,395

(22) Filed: May 25, 1999

Related U.S. Application Data

(62) Division of application No. 08/879,207, filed on Jun. 19, 1997.

(51) Int. Cl.⁷ .............................................. H01L 21/8242
(52) U.S. Cl. ................................................................ 438/253
(58) Field of Search ........................... 438/253, 254–256, 438/257, 666, 672

(56) References Cited

U.S. PATENT DOCUMENTS

| | | |
|---|---|---|
| 4,758,987 | 7/1988 | Sakui . |
| 5,013,680 | 5/1991 | Lowrey et al. . |
| 5,016,070 | 5/1991 | Sundaresan . |
| 5,091,762 | 2/1992 | Watanabe . |
| 5,100,823 | 3/1992 | Yamada . |
| 5,162,248 | 11/1992 | Dennison et al. . |
| 5,185,646 | 2/1993 | Mizuno . |
| 5,270,241 | 12/1993 | Dennison et al. . |
| 5,298,775 | 3/1994 | Ohya . |
| 5,317,540 | 5/1994 | Furuyama . |
| 5,338,700 | 8/1994 | Dennison et al. . |
| 5,340,765 | 8/1994 | Dennison et al. . |
| 5,341,326 | 8/1994 | Takase et al. . |
| 5,359,566 | 10/1994 | Furuyama . |
| 5,369,612 | 11/1994 | Furuyama . |
| 5,382,826 | 1/1995 | Mojaradi et al. . |
| 5,410,505 | 4/1995 | Furuyama . |
| 5,416,350 | 5/1995 | Watanabe . |
| 5,425,392 | 6/1995 | Thakur et al. . |
| 5,432,733 | 7/1995 | Furuyama . |
| 5,444,652 | 8/1995 | Furuyama . |
| 5,479,112 | 12/1995 | Choi et al. . |
| 5,494,841 | 2/1996 | Dennison et al. . |
| 5,500,815 | 3/1996 | Takase et al. . |
| 5,514,884 | 5/1996 | Hively et al. . |
| 5,519,236 | 5/1996 | Ozake . |
| 5,525,820 | 6/1996 | Furuyama . |
| 5,783,471 | * 7/1998 | Chu ....................................... 438/257 |

* cited by examiner

Primary Examiner—Charles Bowers
Assistant Examiner—Craig Thompson
(74) Attorney, Agent, or Firm—Killworth, Gottman, Hagan & Schaeff, L.L.P.

(57) ABSTRACT

A dynamic random access memory (DRAM) includes a plurality of memory cells aligned with one another along a pair of wordlines with each wordline being connected to access alternate ones of the memory cells. The DRAM has aligned memory cells having cell areas of $6F^2$ yet exhibiting substantially the same superior signal-to-noise performance found in DRAM's having staggered $8F^2$ memory cells. The DRAM memory cells are formed by transistor stacks which are aligned along and interconnected by wordlines extending between and included within the transistor stacks. By forming the wordlines as a part of the transistor stacks, the wordlines are narrow ribbons of conductive material. During formation of the transistor stacks, the wordlines are connected so that a first wordline controls access transistors of every other one of the memory cells and a second wordline controls the access transistors of the remaining memory cells. Thus, the first wordline accesses a first series of alternate memory cells, such as the odd memory cells, and the second wordline accesses a second series of alternate memory cells, such as the even memory cells, with the first and second series of memory cells being interleaved with one another.

9 Claims, 14 Drawing Sheets

METHOD OF MAKING HIGH DENSITY SEMICONDUCTOR MEMORY

CROSS REFERENCE TO RELATED APPLICATIONS

This application is a division of U.S. patent application Ser. No. 08/879,207, filed Jun. 19, 1997.

BACKGROUND OF THE INVENTION

The present invention relates in general to semiconductor memories and, more particularly, to an improved dynamic random access memory (DRAM) and method for making such a DRAM wherein a plurality of memory cells are aligned with one another along a pair of wordlines with each wordline being connected to access alternate ones of the memory cells to provide a DRAM having a reduced memory cell size in relation to the superior signal-to-noise performance of the memory.

While device density in DRAM's is of course limited by the resolution capability of available photolithographic equipment, it is also limited by the form of the individual memory cells used to make the DRAM's and the corresponding areas of the memory cells. The minimum area of a memory cell may be defined with reference to a feature dimension (F) which ideally refers to the minimum realizable process dimension; however, in reality F refers to the dimension that is half the wordline WL pitch (width plus space) or digitline DL pitch (width plus space). Wordline pitch WP and digitline pitch DP are shown in FIG. 1 which illustrates aligned memory cells used to form a DRAM wherein all memory cells along a wordline are simultaneously accessed and the area of each memory cell is $3F \cdot 2F = 6F^2$.

Reference is made to FIG. 1 to illustrate this definition of cell area wherein the $6F^2$ memory cell 100 is for an open digitline array architecture. In FIG. 1, a box is drawn around the memory cell 100 or memory bit to show the cell's outer boundary. Along the horizontal axis of the memory cell 100, the box includes one-half digitline contact feature 102, one wordline feature 104, one capacitor feature 106 and one-half field oxide feature 108, totaling three features. Along the vertical axis of the memory cell 100, the box contains two one-half field oxide features 112, 114 and one active area feature 116, totaling two features such that the structure of the memory cell 100 results in its area being $3F \cdot 2F = 6F^2$.

FIG. 2 illustrates another memory cell which is used to produce DRAM's having superior signal-to-noise performance and wherein the area of each memory cell 120 is $4F \cdot 2F = 8F^2$. The $8F^2$ memory cell 120 of FIG. 2 is for a folded array architecture and a box is drawn around the memory cell 120 or memory bit to show the cell's outer boundary.

Along the horizontal axis of the memory cell 120, the box includes one-half digitline contact feature 122, one wordline feature 124, one capacitor feature 126, one field poly feature 128 and one-half field oxide feature 130, totaling four features. Along the vertical axis of the memory cell 120, the box contains two one-half field oxide features 132, 134 and one active area feature 136, totaling two features such that the structure of the memory cell 120 results in its area being $4F \cdot 2F = 8F^2$.

The increased memory cell area is due to the staggering of the memory cells so that they are no longer aligned with one another which permits each wordline to connect with an access transistor on every other digitline. For such alternating connections of a wordline, the wordline must pass around access transistors on the remaining digitlines as field poly. Thus, the staggering of the memory cells results in field poly in each memory cell which adds two square features to what would otherwise be a $6F^2$ structure.

Although the $8F^2$ staggered memory cells are 25% larger than the aligned $6F^2$ memory cells, they produce superior signal-to-noise performance, especially when combined with some form of digitline twisting. Accordingly, $8F^2$ memory cells are the present architecture of choice.

There is an ongoing need to produce high performance DRAM's which include more memory cells within the same area of DRAM real estate. In particular, it would be desirable to be able to produce DRAM's having aligned $6F^2$ memory cells which have substantially the same superior signal-to-noise performance found in DRAM's having staggered $8F^2$ memory cells.

SUMMARY OF THE INVENTION

This need is currently being met by the methods and apparatus of the present invention wherein an improved dynamic random access memory (DRAM) includes a plurality of memory cells aligned with one another along a pair of wordlines with each wordline being connected to access alternate ones of the memory cells to provide a DRAM having reduced memory cell area and superior signal-to-noise performance. In particular, as illustrated, the improved DRAM has aligned memory cells having cell areas of $6F^2$ yet exhibiting substantially the same superior signal-to-noise performance found in DRAM's having staggered $8F^2$ memory cells.

The improved DRAM memory cells are formed by transistor stacks which are aligned along and interconnected by wordlines extending between and included within the transistor stacks. By forming the wordlines as a part of the transistor stacks, the wordlines are narrow ribbons of conductive material. During formation of the transistor stacks, the wordlines are connected so that a first wordline controls access transistors of every other one of the memory cells and a second wordline controls the access transistors of the remaining memory cells. Thus, the first wordline accesses a first series of alternate memory cells, such as the odd memory cells, and the second wordline accesses a second series of alternate memory cells, such as the even memory cells, with the first and second series of memory cells being interleaved with one another.

As illustrated, two memory cells are incorporated into a memory cell pair with the two memory cells sharing a digitline. For such memory cell pair structures, first and second wordlines are formed into transistor stacks forming first access transistors of the memory cell pairs and third and fourth wordlines are formed into transistor stacks forming second access transistors of the memory cell pair. The two transistor stacks are separated from one another by a digitline which is connected to first and second capacitors formed on the other sides of the transistor stacks by the access transistors to form the DRAM.

It is an object of the present invention to provide an improved DRAM having superior signal-to-noise ratio for the area of the memory cells making up the DRAM; to provide an improved DRAM wherein aligned memory cells are formed along a pair of wordlines with one of the wordlines being connected to access alternate ones of the memory cells and the other wordline being connected to access the remaining memory cells; and, to provide an improved DRAM wherein memory cells include transistor stacks and are aligned along and interconnected by wordlines extending between and included within the transistor stacks.

Other objects and advantages of the invention will be apparent from the following description, the accompanying drawings and the appended claims.

DETAILED DESCRIPTION OF THE INVENTION

Figure 1:
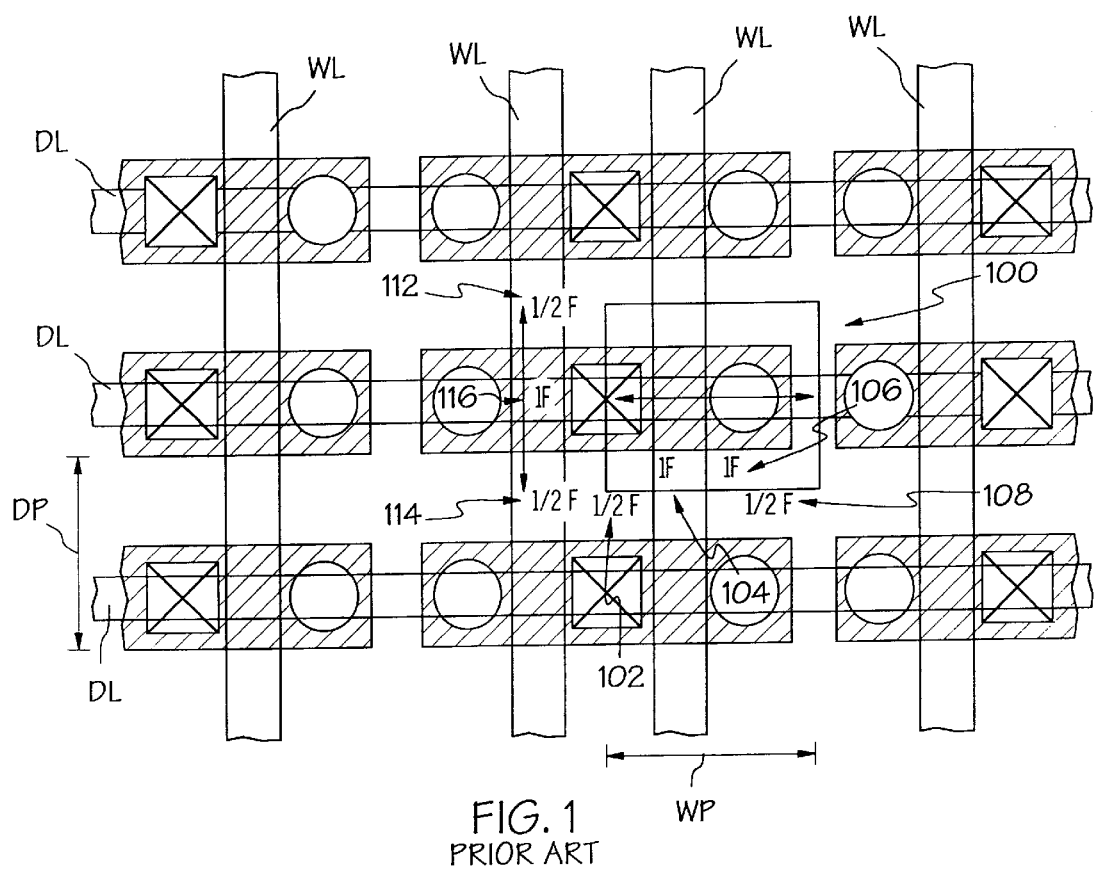
FIG. 1 illustrates a prior art open digitline memory array layout made up of aligned $6F^2$ memory cells.
Figure 2:
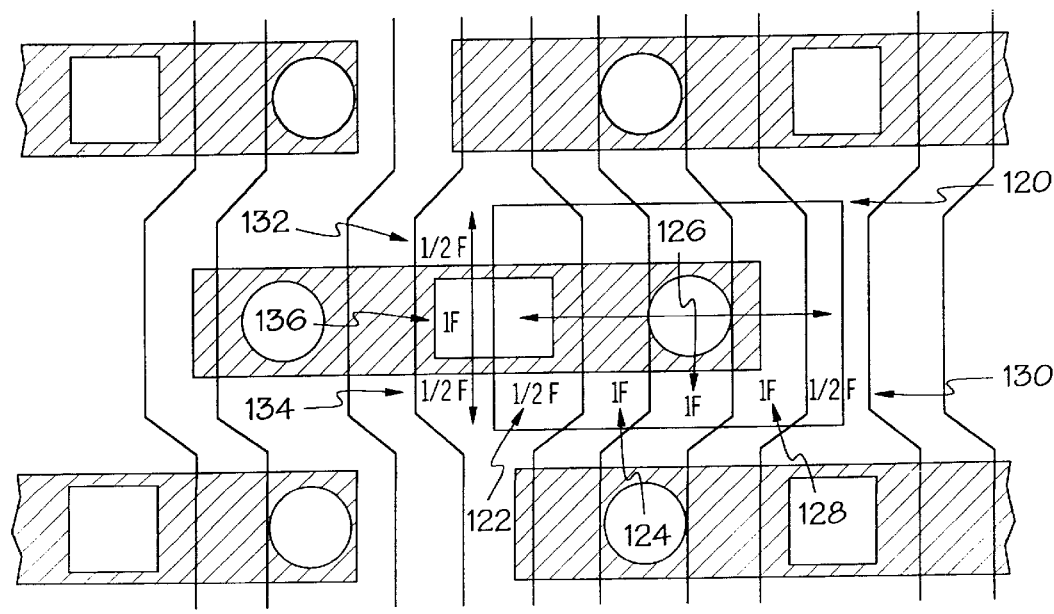
FIG. 2 illustrates a prior art folded array memory layout made up of staggered $8F^2$ memory cells having improved signal-to-noise performance relative to the memory array of FIG. 1.
Figure 3:
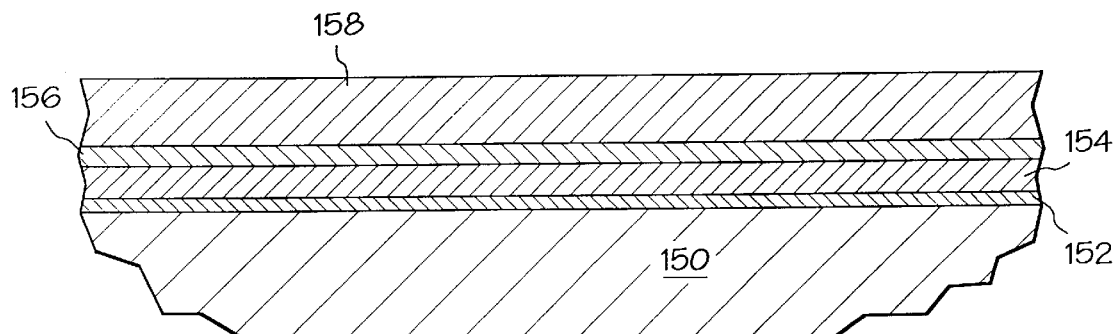
FIGS. 3–17 illustrate a method in accordance with the present invention for forming a high performance DRAM in accordance with the present invention including aligned $6F^2$ memory cells and having substantially the same superior signal-to-noise performance as that of DRAM's having the staggered $8F^2$ memory cells of the memory layout of FIG. 2.

A method for making an improved dynamic random access memory (DRAM) will now be described with reference to FIGS. 3–17. As shown in FIG. 3, the DRAM is made on a base layer or silicon structure 150 which can be one or more semiconductor layers or structures and include active or operable portions of semiconductor devices. A gate oxide layer 152 is formed on the silicon structure 150. Three additional layers, a polysilicon layer 154, a silicide layer 156 such as tungsten silicide (wsix) or titanium silicide, and a nitride layer 158 are formed over the gate oxide layer 152.

Figure 4:
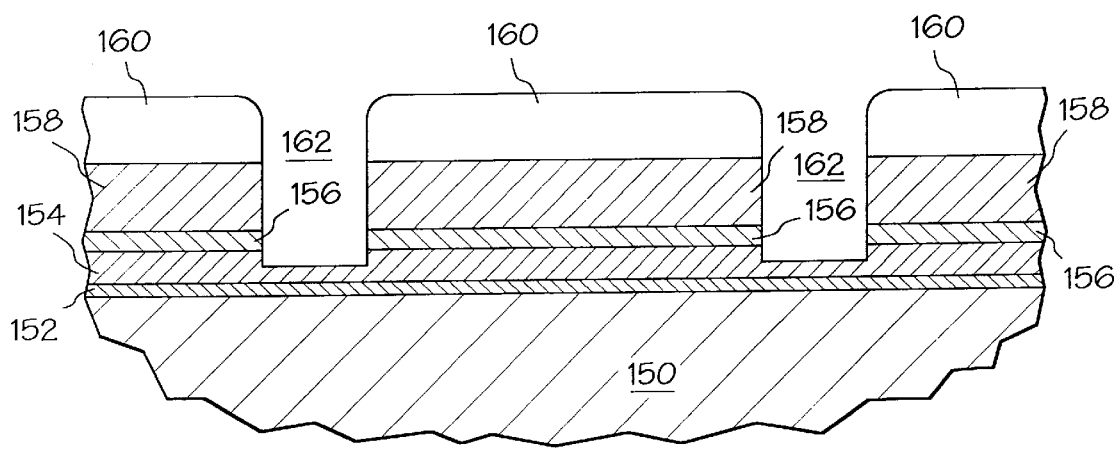

A photo resist pattern 160 is formed over the nitride layer 158 to form an array of areas corresponding to $6F^2$ memory cells to be formed, see FIG. 4. The remaining areas 162 which are not masked by the photo resist pattern 160 are etched through the nitride layer 158, the silicide layer 156 and partially into the polysilicon layer 154. Preferably the etch extends to approximately 50% of the polysilicon layer 154.

Figure 5:
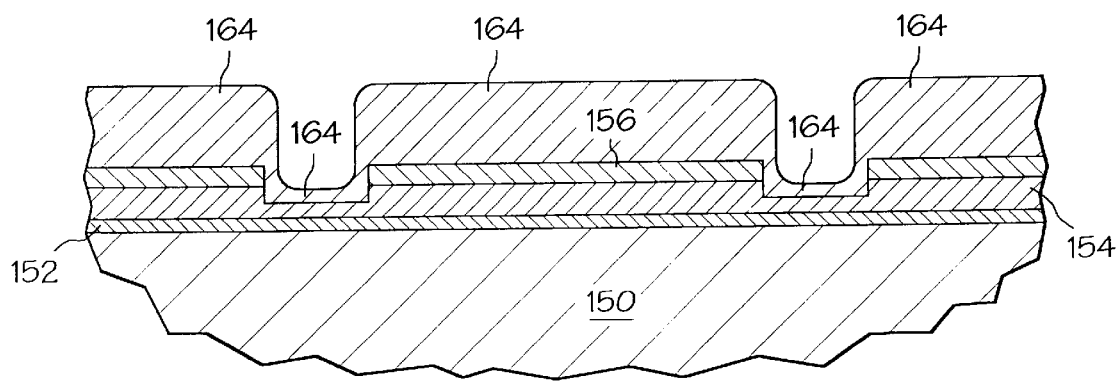
Figure 6:
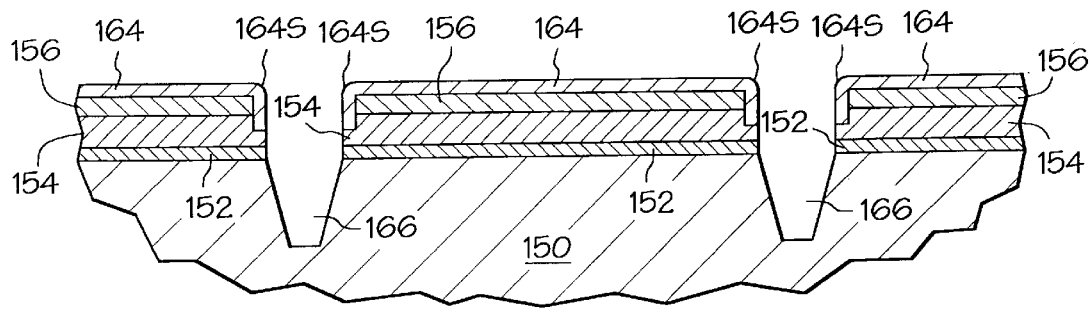
Figure 8:
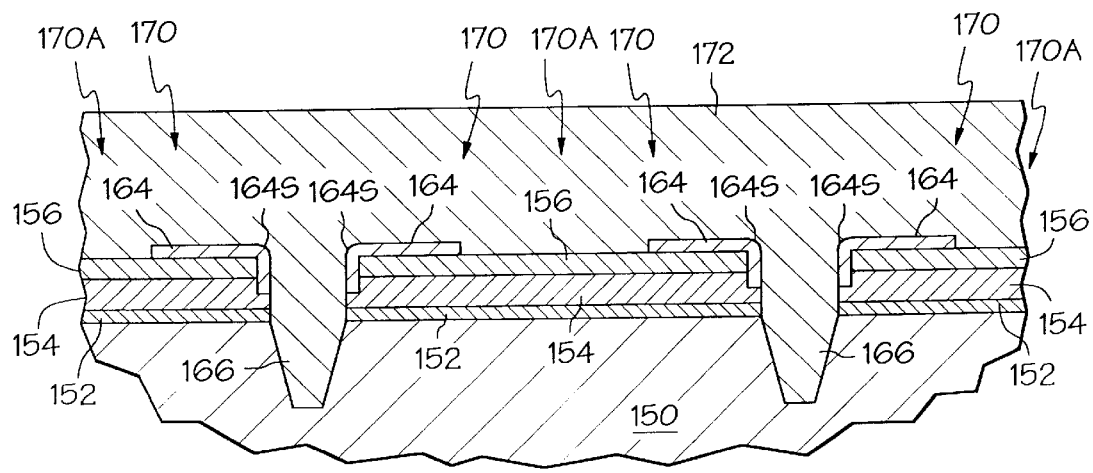
Figure 8A:
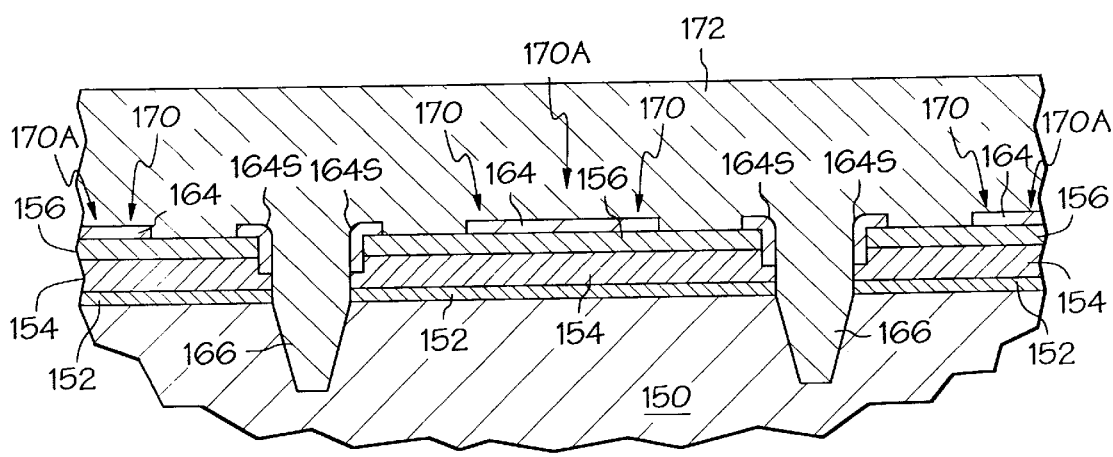

The photo resist pattern 160 is removed and a nitride layer 164 is formed over the resulting structure and substantially merges with the nitride layer 158 where that layer remains, see FIG. 5. A spacer etch operation is performed on the nitride layer 164 to form the spacers 164S and then over-etched to form isolation trenches 166 into the silicon structure 150, see FIG. 6. The nitride layer 158 must be sufficiently thick such that a sufficient amount of the nitride layer 158 remains for further processing after the spacer etch and over-etch operations. However, the thickness of the nitride layer 158 may be reduced if a selective etch is used to form the isolation trenches 166.

A photo resist pattern 168 is formed to define areas 170 wherein wordlines will be formed to connect to the silicide layer 156 for access transistors of the $6F^2$ memory cells to be formed and areas 170A through which digitline contacts will be made, see FIGS. 7, 7A, 8, 8A, 9, 9A, 10, 10A. It is noted that, in the illustrated embodiment, the memory cells are formed differently for alternating rows of the memory cells.

That is, in one series of alternating rows, for example the odd numbered rows R(N+1), R(N+3), . . . R(N+X) where N is an even number and X is an odd number, portions of the silicide layer 156 which form control conductors for each of the transistors in that series of rows, connect to a wordline on the digitline side of the transistors. See FIG. 7B which shows a group of memory cell pairs MCP1–MCP12 illustrating portions of the nitride layer 164 remaining after the etch referred to with reference to FIG. 7.

In the other series of alternating rows, for example the even numbered rows R(N+2), R(N+4), . . . R(N+Y) where N is an even number and Y is an even number, portions of the silicide layer 156 which form control conductors for each of the transistors in. that series of rows, connect to a wordline on the isolation side of the transistors, for these rows see the drawing figures which have an A suffix.

Figure 7:
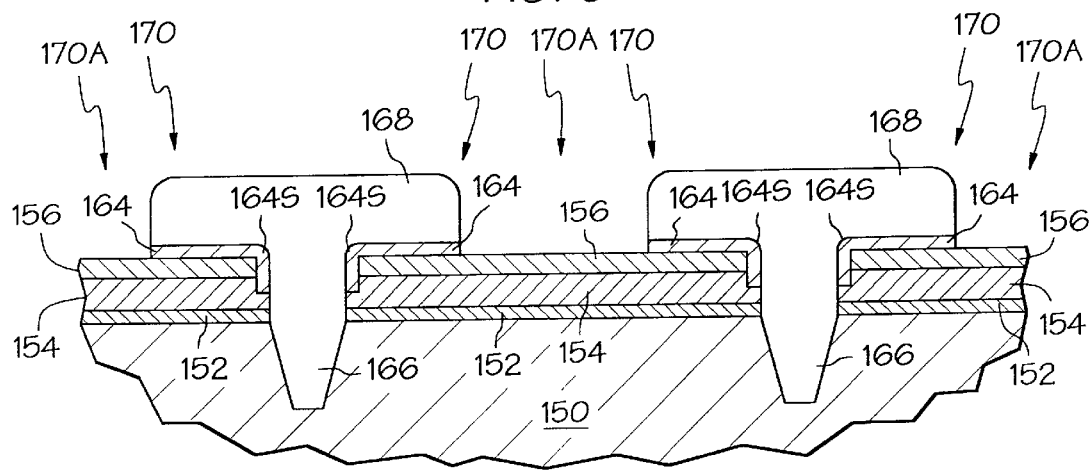
Figure 7A:
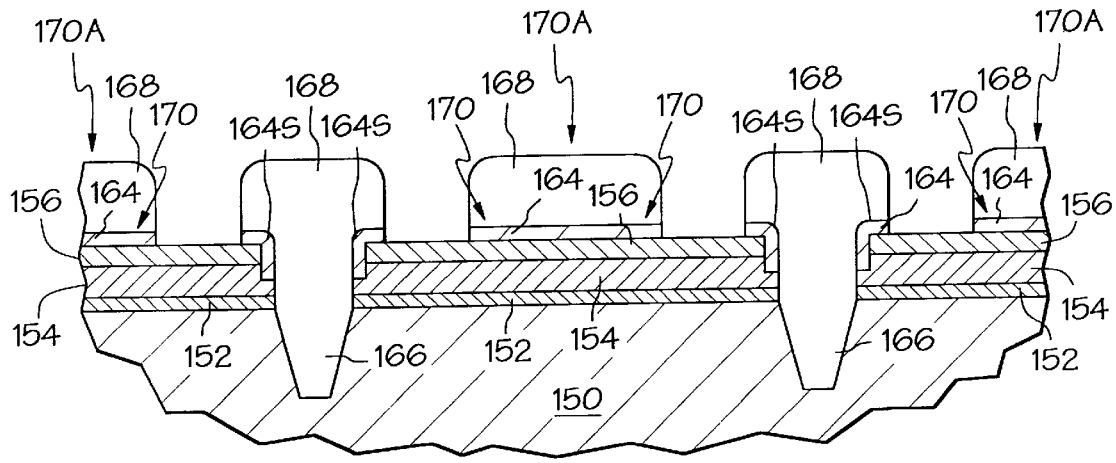
FIGS. 7A, 7B, 8A, 9A, 10A, 11A and 12A show the differing structure for alternating rows of the illustrated embodiment of the present invention.
Figure 7B:
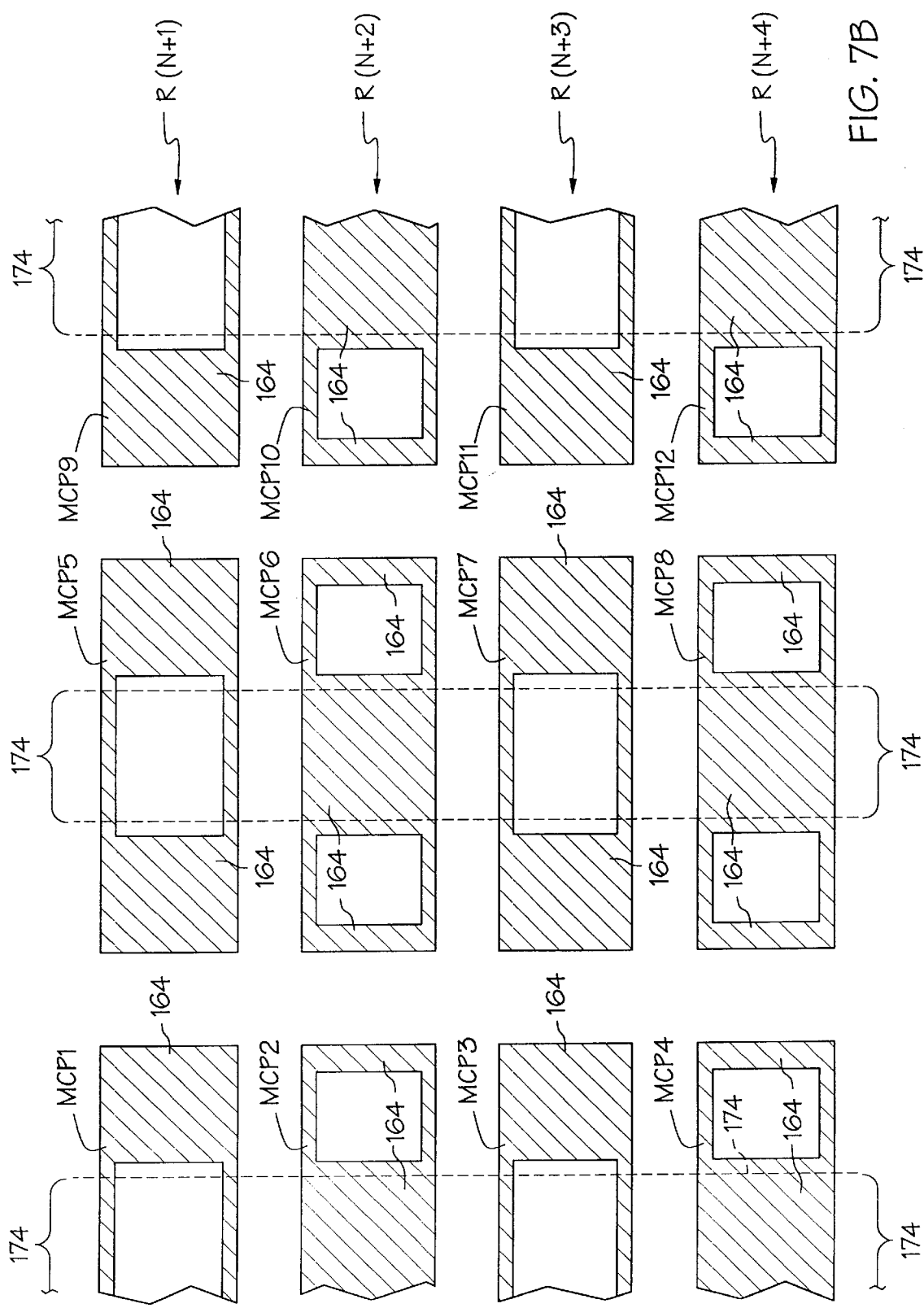

The remaining areas of the nitrite layer 164 which are not covered by the photo resist pattern 168 are etched substantially to the silicide layer 156 leaving the portions of the nitride layer 164 shown in FIG. 7B. The photo resist pattern 168 is then removed and a layer of oxide 172, such as silicon dioxide or tetraethoxysilane (TEOS), is formed over the resulting structure, see FIGS. 8 and 8A.

Figure 9:
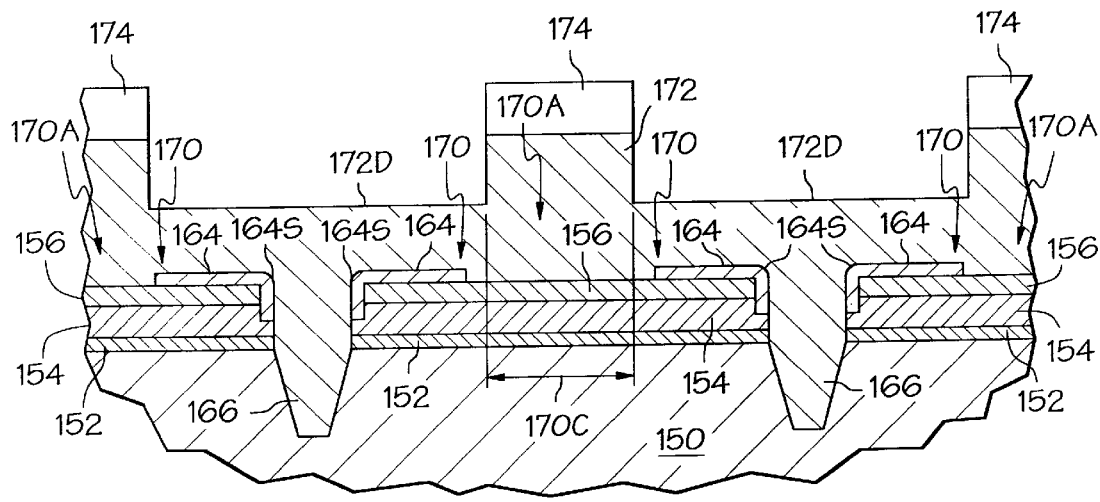
Figure 10:
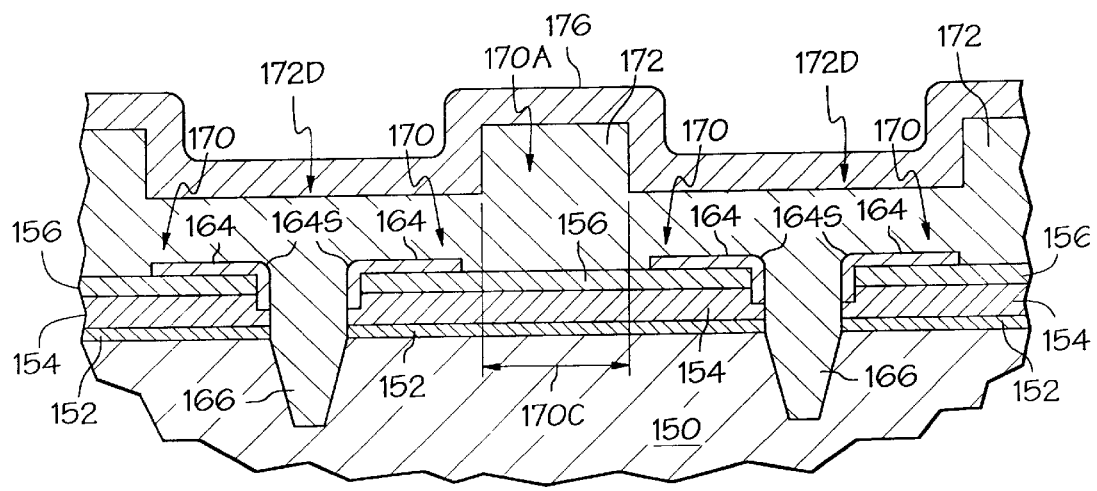
Figure 9A:
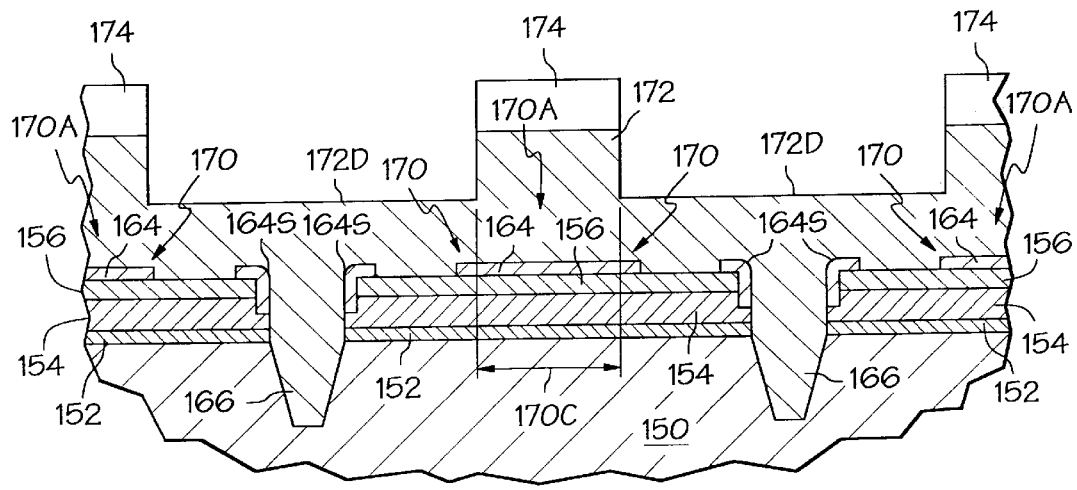
Figure 10A:
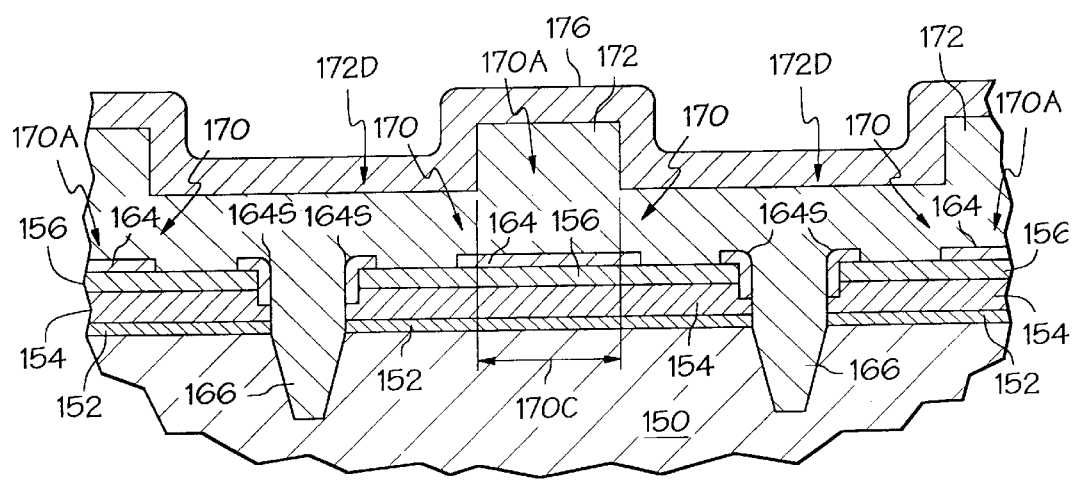

Patterns 174 of photo resist generally corresponding to digitline contact areas are formed over central portions 170C of the areas 170A which extend between the areas wherein the wordlines will be formed, see FIGS. 7B, 9 and 9A. A patterned oxide etch of the layer of oxide 172 is then performed to etch to a depth 172D which will determine the height of nitride spacers which will be formed on the masked portions of the layer of oxide 172. The patterned lines 174 of photo resist are removed and a nitride layer 176 is then formed over the resulting structure, see FIGS. 10 and 10A.

Figure 11:
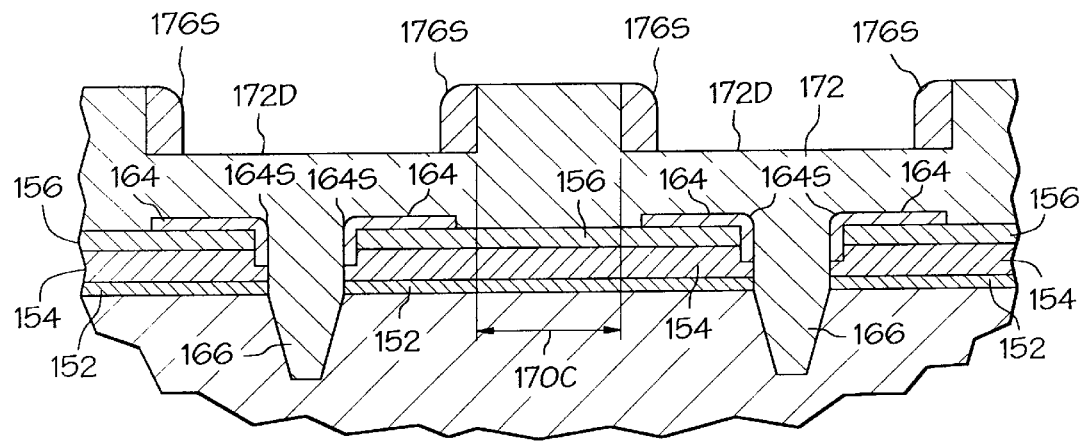
Figure 12:
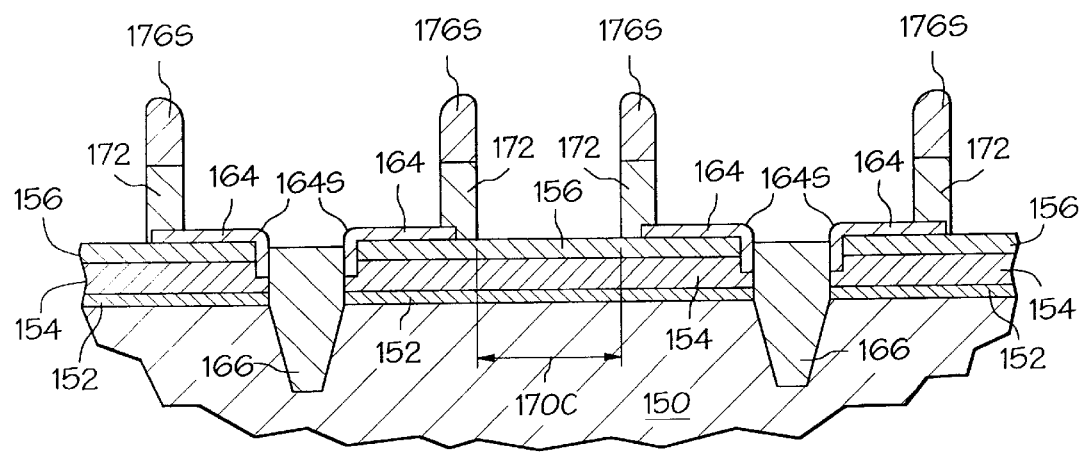
Figure 11A:
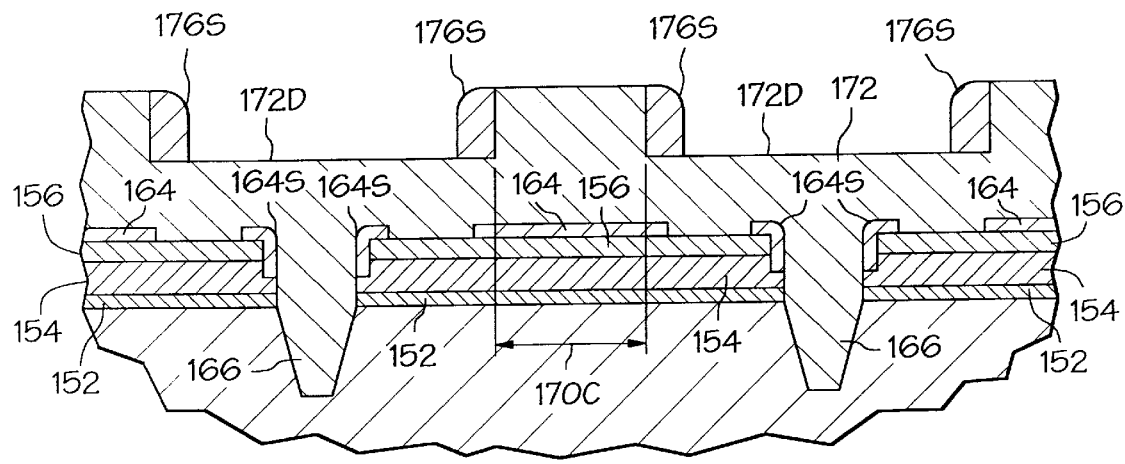
Figure 12A:
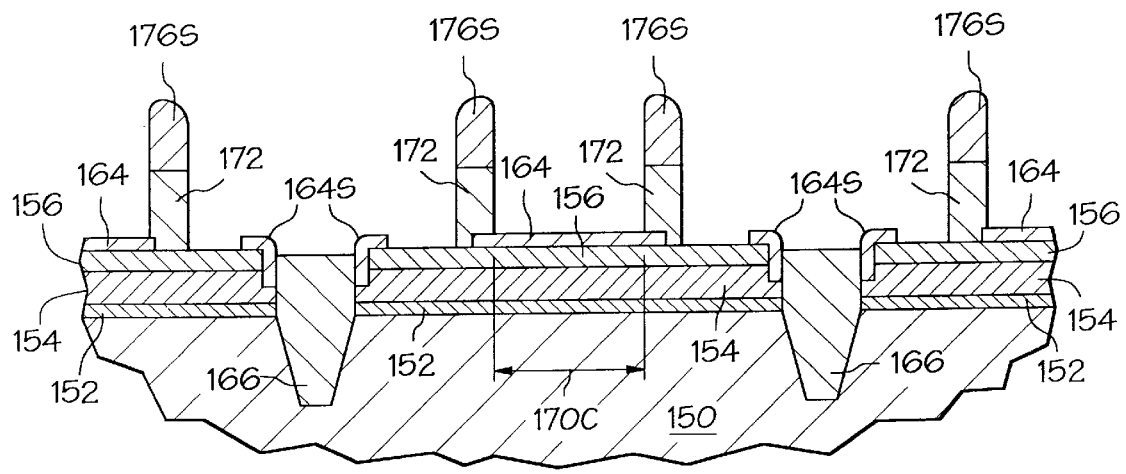

The nitride layer 176 is spacer etched to form nitride spacers 176S which will pattern transistor lines for the DRAM, see FIGS. 11 and 11A. The thickness of the nitride layer 176 is substantially equal to the critical dimension (CD) of the access transistors plus any loss which will be incurred during the spacer etch of the nitride layer 176 so that the spacers 176S will be properly sized. A selective etch is then performed on the layer of oxide 172 with the nitride spacers 176S serving as a pattern mask for the etch, see FIGS. 12 and 12A. The layer of oxide 172 is thus etched down to the nitride layer 164 and the silicide layer 156. The remainder of the process description will be made with reference to drawings illustrating only the odd numbered rows R(N+1), R(N+3), . . . R(N+X) since the steps performed are the same for both the even numbered rows and the odd numbered rows.

Figure 13:
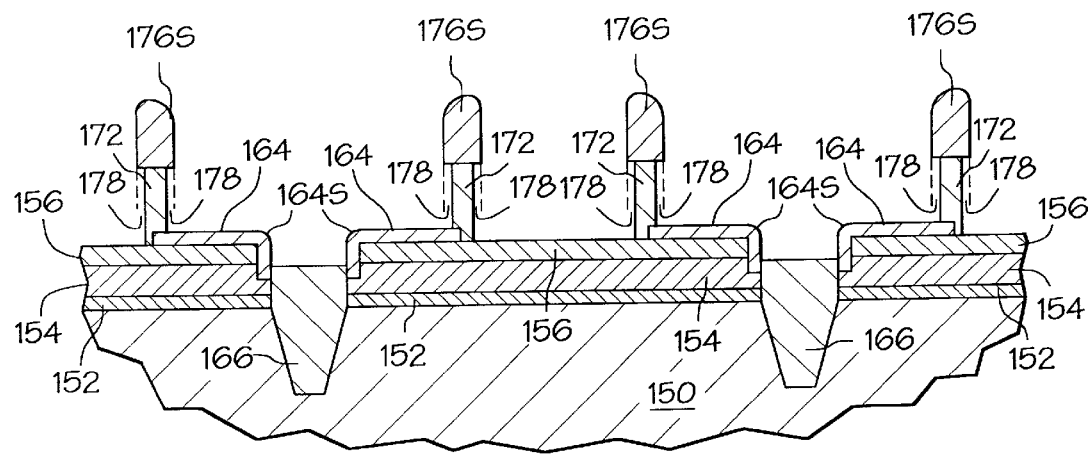

The oxide 172 is then selectively isotropically etched, for example by a hydrofluoric acid (HF) wet etch, by a desired amount 178, see FIG. 13. The amount of etching substantially corresponds to the size of conductors which will be formed on the remaining oxide 172 to define wordlines for the DRAM. It is to be understood that two or three of the prior etches may be preformed in situ. A layer of conductive material 180, for example tungsten silicide (wsix) or titanium silicide with a tinitride barrier layer, is formed over the resulting structure, see FIG. 14.

Photo resist material can now be patterned peripheral to the DRAM array to pattern large transistors and pads for connecting to the digitlines which are then formed by etching, at least in part selective etching, the conductive material 180. In addition to etching the conductive material 180, etching operations are performed to remove those portions of the nitride layer 164 and the silicide layer 156 which extend beyond the pattern defined by the nitride spacers 176S. It is noted that the nitride spacers 176S must have sufficient material to withstand these etching operations. A highly selective etch of the polysilicon layer 154 which extend beyond the pattern defined by the nitride spacers 176S is performed to or through the gate oxide layer 152, see FIG. 15.

Figure 14:
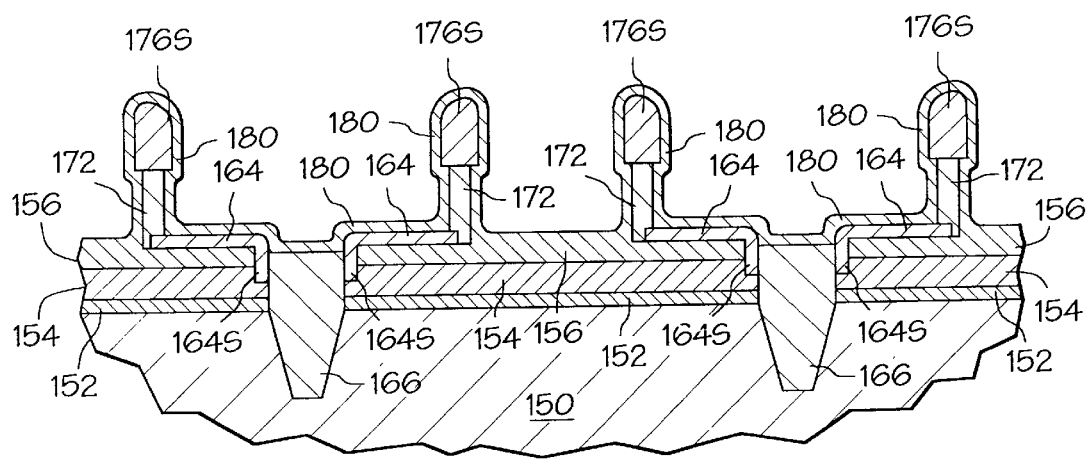

At this point in the method, a series of aligned transistor stacks 182 with each one of the stacks 182 including a portion of the gate oxide layer 152, a portion of the polysilicon layer 154, a portion of the silicide layer 156, and a pair of wordlines 184, 186 which remain from the conductive material 180 formed in an earlier step described relative to FIG. 14, have been formed.

Figure 15:
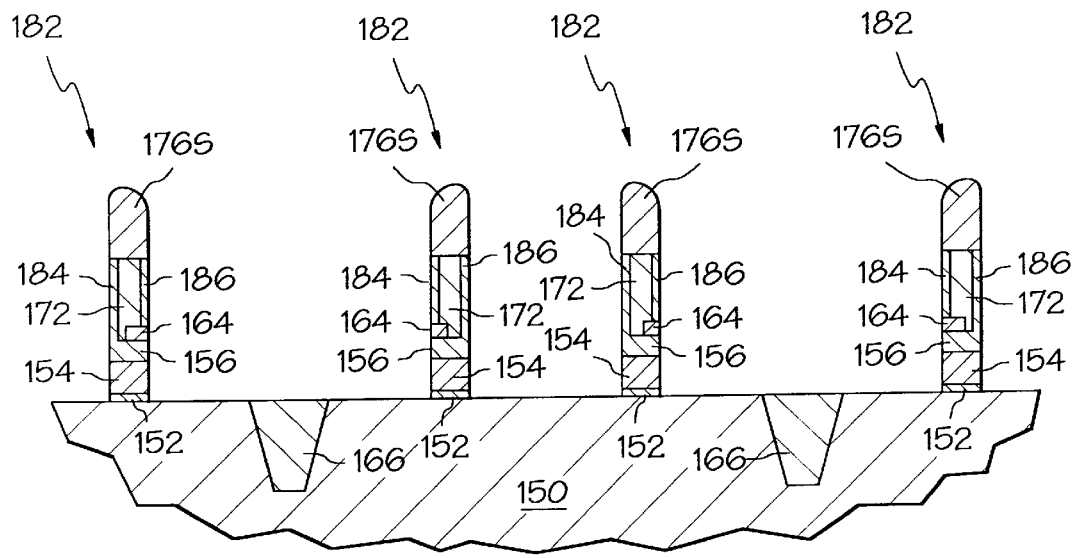
Figure 18:
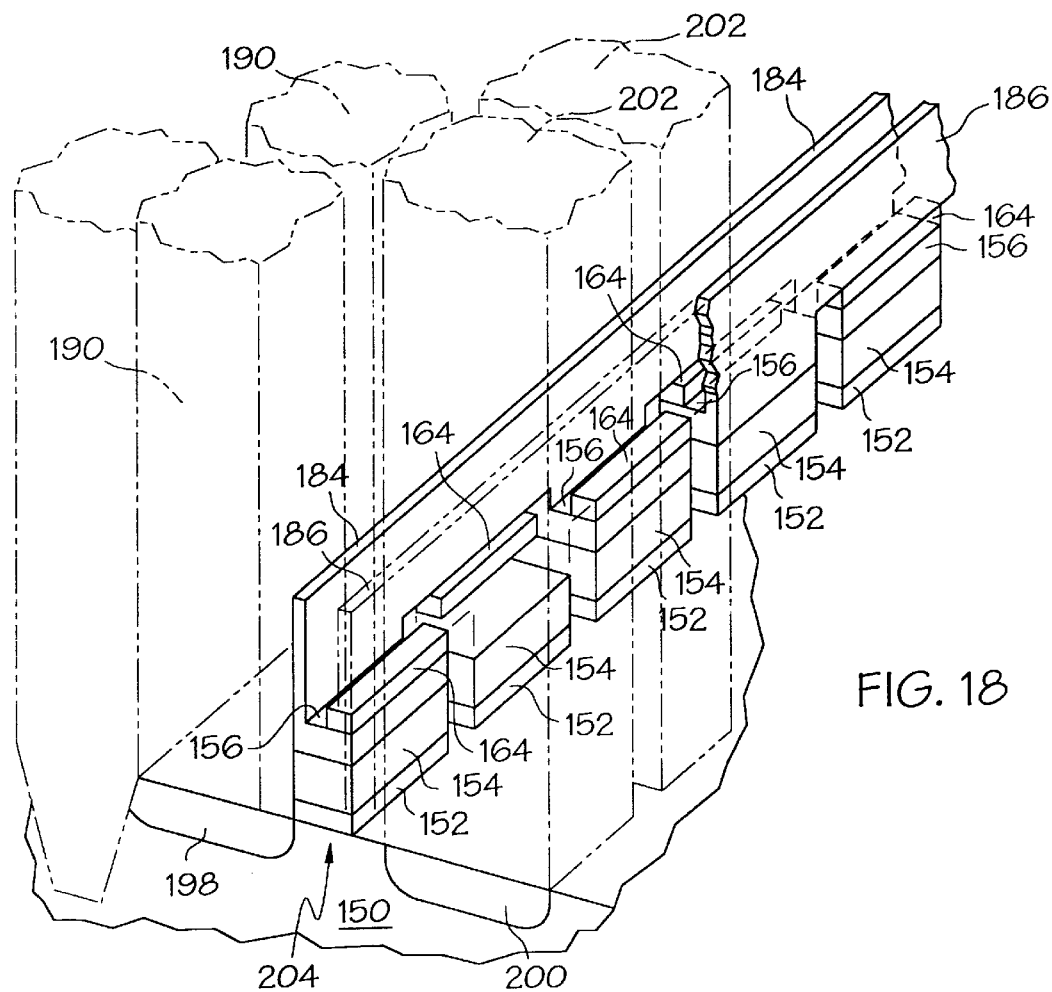
FIG. 18 is a schematic isometric view of a portion of a DRAM showing portions of a series of $6F^2$ memory cells aligned along two wordlines.

It is apparent from FIGS. 15 and 18 that the wordlines 184 are connected to the portions of the silicide layer 156 for every other one of the transistor stacks 182; and in those transistor stacks where the wordlines 184 are connected, the wordlines 186 are insulated from the portions of the silicide layer 156 by portions of the nitride layer 164. In the same manner, the wordlines 186 are connected to the portions of the silicide layer 156 for the remaining ones of the transistor stacks 182; and in those transistor stacks where the wordlines 186 are connected, the wordlines 184 are insulated from the portions of the silicide layer 156 by portions of the nitride layer 164. This alternating connection of the wordlines extends in both directions of the array of memory cells forming the DRAM, i.e., across the rows of memory cells as illustrated in FIG. 15 and also along the columns of memory cells or into the sheet of the drawing figures, see FIG. 18.

It is noted that the insulating portions of the nitride layer 164 for each memory cell pair are on the outer sides of the individual memory cells; however, the insulating portions of the nitride layer 164 can be on the inner sides of the individual memory cells, on opposite sides of the memory cells, i.e., the inner side of one memory cell of a memory cell pair and the outer side of the other memory cell. The requirement for placement of the insulating portions of the nitride layer 164 in the memory cells is that alternating ones of the memory cells are connected to wordlines 184 and the remaining interleaved memory cells are connected to the wordlines 186.

Figure 16:
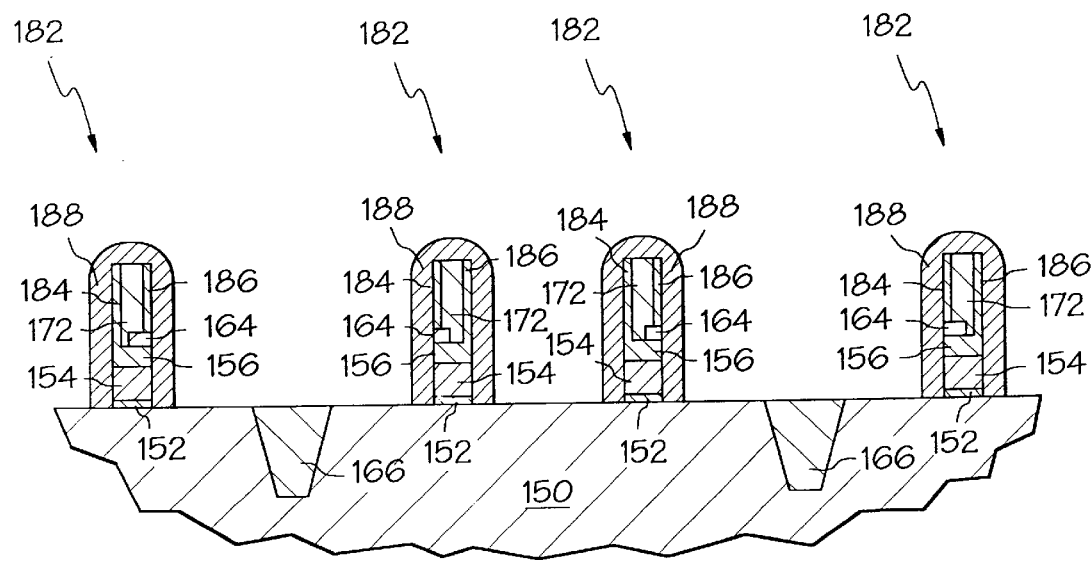

A nitride layer is then formed on the resulting structure and spacer etched to form nitride spacers 188 on the sidewalls of the transistor stacks 182, see FIG. 16. The ends of the wordlines 184, 186 must be severed in the periphery of the DRAM array to electrically isolate the wordlines from one another. This can be done as a separate step; however, it is preferred to expose the areas to repeated subsequent etches until the conductive material is severed. In any event, after the wordlines are severed and peripheral transistors are formed in a conventional manner, a tetraethoxysilane (TEOS) barrier layer is formed followed by a borophosphosilate glass (BPSG) layer and the resulting structure is then planarized, if necessary.

Figure 17:
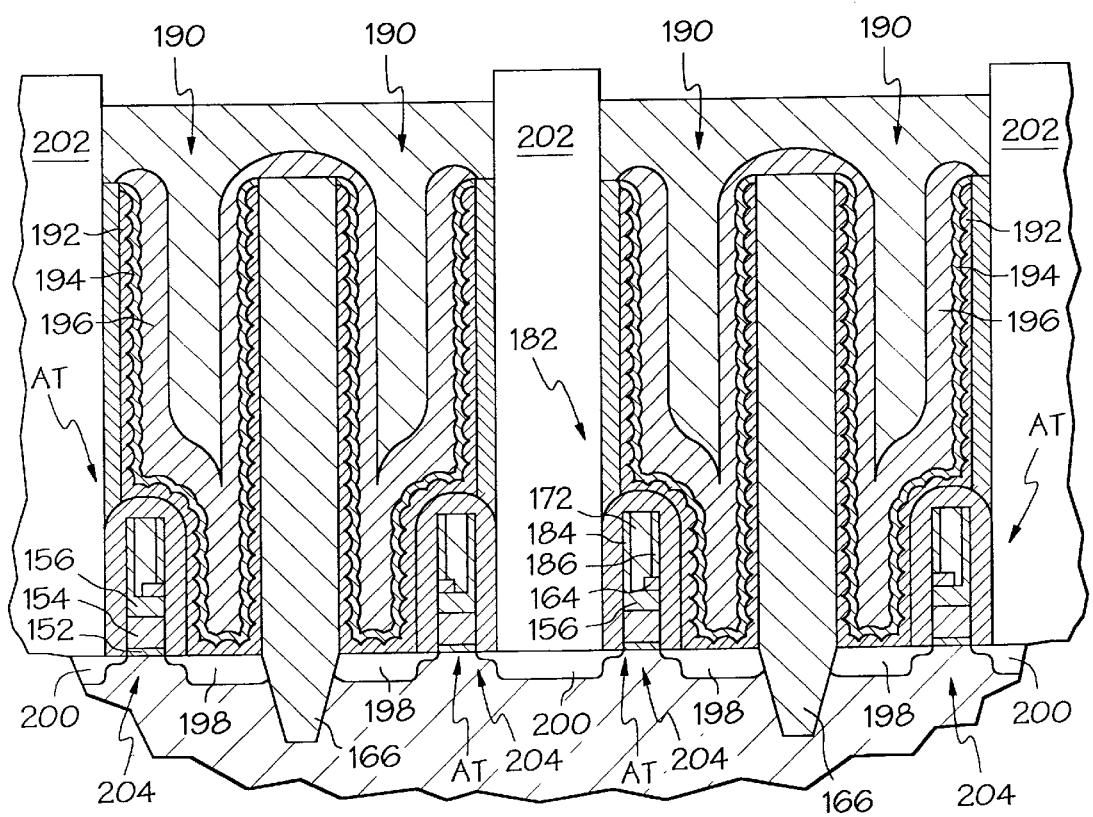

Capacitors 190 are then formed for the DRAM as shown in FIG. 17 which illustrates a completed DRAM in accordance with the present invention. The capacitors 190 are illustrated in FIG. 17 as being container capacitors; however, a wide variety of capacitor structures and process flows can be used for the DRAM capacitors of the present invention.

As illustrated, the capacitors 190 can be formed by etching container cell capacitors contact openings into the BPSG and TEOS. A layer of polysilicon, hemispherical grain polysilicon 192 as illustrated, is then formed followed by the formation of a thick oxide layer which can be rapidly etched. The oxide layer is then removed down to the polysilicon 192, preferably by chemical mechanical polishing (CMP), with the upper portions of polysilicon 192 being removed. An oxide etch is performed to remove the oxide from the containers and a dielectric layer 194 is formed. The portions of the dielectric layer formed over the oxide is removed and a polysilicon layer 196 is formed. This process flow is substantially in accordance with the disclosure of U.S. Pat. No. 5,270,241 which should be referred to for additional details regarding the capacitors 190 and is incorporated herein by reference.

The DRAM of FIG. 17 illustrates diffusion areas 198 which are connected to the capacitors 190 and diffusion areas 200 which are connected to digitlines for the DRAM via digitline contacts 202 with channel areas 204 for access transistors AT, the channel areas 204 corresponding to and underlying the transistor stacks 182. FIG. 18 is a schematic isometric view showing a series of $6F^2$ memory cells aligned along two wordlines 184, 186. FIG. 18 illustrates the alternating connections of the wordlines 184, 186 to the portions of the silicide layer 156 included within the transistor stacks 182 and alternating insulations of the wordlines 184, 186 from the portions of the silicide layer 156 included within the transistor stacks 182. Portions of the DRAM are not shown for ease of illustration and to more clearly show the interconnections of the transistors along the wordlines 184, 186.

With this understanding of the method of the present invention for making a DRAM, the DRAM of the present invention will now be described with reference to FIG. 19 which shows a series of $6F^2$ memory cells 210–218 and $6F^2$ memory cell pairs such as a memory cell pair 220. Since the plurality of memory cells and memory cell pairs of the DRAM are substantially the same, the following description will be made with reference to the memory cell pair 220. The memory cells 212, 214 each comprise one access transistor 222, 224, respectively, and one capacitor 226, 228, respectively. Thus, the memory cells 212, 214 form the memory cell pair 220 which comprises first and second access transistors 222, 224 and first and second capacitors 226, 228. The first access transistor 222 selectively connects a digitline 230 to the first capacitor 226 and the second access transistor 224 selectively connects the digitline 230 to the second capacitor 228.

A substantially linear first wordline 232 is connected to control the access transistors of every other one of the plurality of memory cells aligned along the first wordline 232 and a substantially linear second wordline 234; however, the first wordline 232 is insulated from the first access transistor 222 of the memory cell 212 and hence the memory cell pair 220, see FIG. 18. The second wordline 234 is connected to control the access transistors of the remaining ones of the plurality of memory cells which are aligned along the first and second wordlines 232, 234 including the first access transistor 222, see FIG. 18.

A substantially linear third wordline 236 is connected to control the access transistors of every other one of the plurality of memory cells aligned along the third wordline 236 and a substantially linear fourth wordline 238 including the second access transistor 224. The fourth wordline 238 is connected to control the access transistors of the remaining ones of the plurality of memory cells which are aligned along the third and fourth wordlines 236, 238; however, the fourth wordline 238 is insulated from the second access transistor 224 of the memory cell 212 and hence the memory cell pair 220, see FIG. 18. Thus, the memory cell pairs, for example the memory cell pair 220, are aligned with one another along the first wordline 232, the second wordline 234, the third wordline 236 and the fourth wordline 238.

The first and second access transistors 222, 224 can be numbered and the first wordline 232 connected to odd (or even) numbered ones of the first access transistors and the second wordline 234 connected to even (or odd) numbered ones of the first access transistors and the third wordline 236 connected to odd (or even) numbered ones of the second access transistors and the fourth wordline 238 connected to even (or odd) numbered ones of the second access transistors. Typically, the first and second access transistors would be similarly numbered so that the access transistors in a memory cell pair would both be odd or even; however, it is possible to have the first and second transistors numbered so that one of the access transistors of a memory cell pair is odd and the other is even. The various numbering schemes comply with the above description made relative to FIGS. 15 and 18 which describes how the alternating connections of the wordlines can be made.

Figure 19:
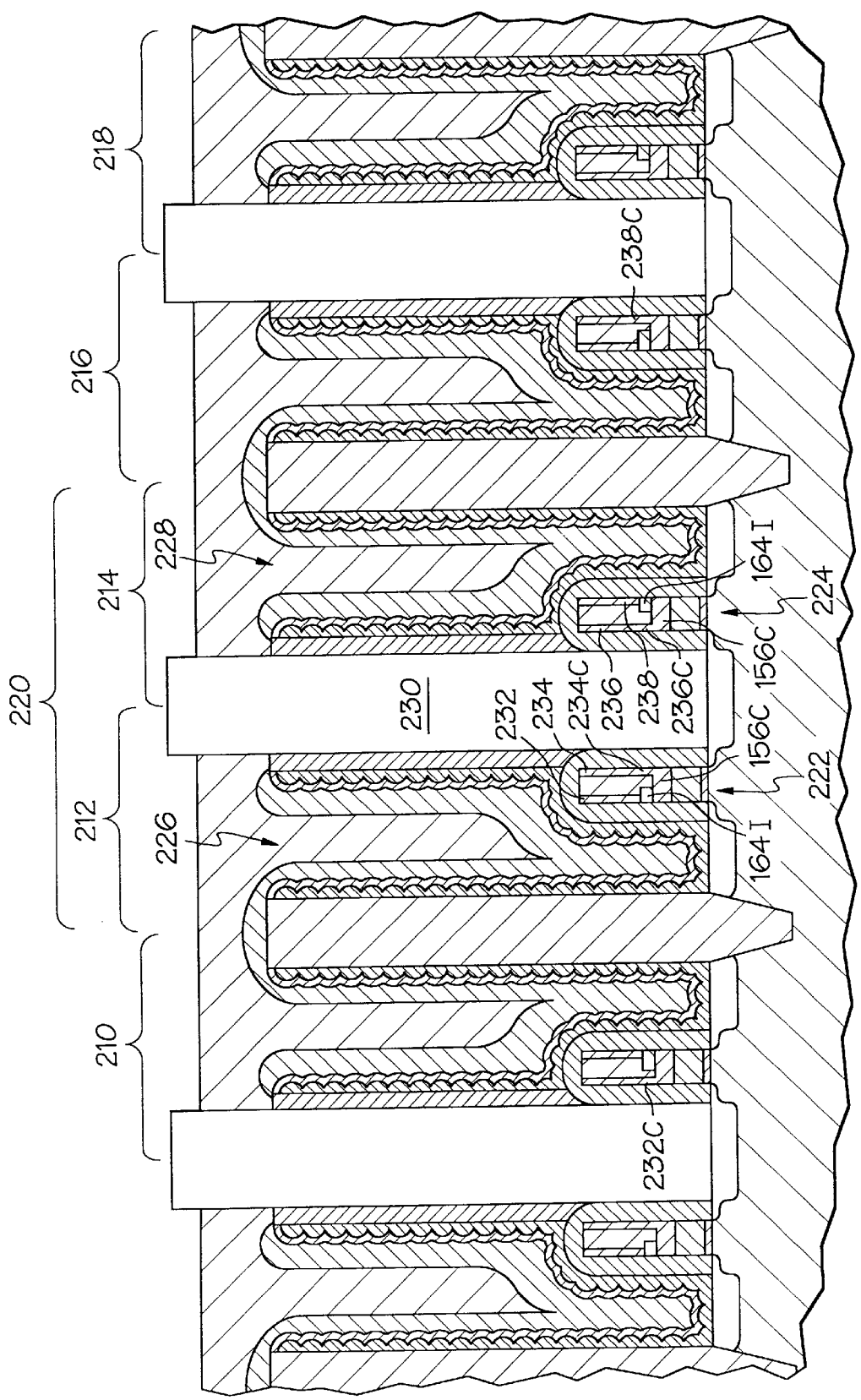
FIG. 19 illustrates $6F^2$ memory cells and $6F^2$ memory cell pairs of the present invention.

From a review of FIG. 19, it is apparent that the first access transistor 222 of the memory cell pair 220 comprises a control conductor 156C which is insulated from the first wordline 232 by insulating material such as a nitride insulator 164I (memory cell pairs alternating with the memory cell pair 220 comprise control conductors 156C and first conductors 232C, or first conductor links, an example of which is shown for a comparable first conductor of another memory cell pair) and a second conductor 234C, or second conductor link, connected to the second wordline 234. Similarly, the second access transistor 224 comprises a control conductor 156C and a third conductor 236C, or third conductor link, connected to the third wordline 236. The control conductor 156C of the second access transistor 224 is insulated from the fourth wordline 238 by insulating material such as a nitride insulator 164I (memory cell pairs alternating with the memory cell pair 220 comprise control conductors 156C and fourth conductors 238C, or conductor links, an example of which is shown for a comparable first conductor of another memory cell pair).

The conductors 232C, 234C, 236C, 238C can be considered as being bifurcated and extending from the first through fourth wordlines 232, 234, 236, 238 with either conducting links or insulators being inserted into one of the bifurcations to either connect the conductors to the control conductors 156C or insulate the conductors from the control conductors 156C. Such a bifurcated structure may be envisioned by considering the lower portions of the wordlines 232, 234, 236 and 238 as being the two extensions of the bifurcation. It is apparent from the drawing figures that the memory cells including the first access transistors are aligned along the first and second wordlines 232, 234; that the memory cells including the second access transistors are aligned along the third and fourth wordlines 236, 238; and, that the memory cell pairs are aligned along the first, second, third and fourth wordlines 232, 234, 236, 238.

Having thus described the invention of the present application in detail and by reference to preferred embodiments thereof, it will be apparent that modifications and variations are possible without departing from the scope of the invention defined in the appended claims.

What is claimed is:

1. A method of making a semiconductor memory comprising the steps of:

forming a plurality of memory cells in alignment with one another, each of said memory cells comprising a first access transistor and a first capacitor, said first access transistor selectively connecting a digitline to said first capacitor;

forming a first wordline through said plurality of memory cells in alignment with said first access transistors of said plurality of memory cells;

forming a second wordline through said plurality of memory cells in alignment with said first access transistors of said plurality of memory cells;

connecting said first wordline to control elements of every other one of said first access transistors of said plurality of memory cells; and connecting said second wordline to control elements of remaining first access transistors of said plurality of memory cells.

2. A method as claimed in claim 1 wherein each of said plurality of memory cells forms half of a memory cell pair which further comprises a second access transistor and a second capacitor, said second access transistor selectively connecting said digitline to said second capacitor, said method further comprising the steps of:

forming a third wordline through said plurality of memory cell pairs in alignment with said second access transistors of said plurality of memory cell pairs;

forming a fourth wordline through said plurality of memory cell pairs in alignment with said second access transistors of said plurality of memory cell pairs;

connecting said third wordline to control elements of every other one of said second access transistors of said plurality of memory cell pairs; and connecting said fourth wordline to control elements of remaining second access transistors of said plurality of memory cell pairs.

3. A method of making a semiconductor memory comprising the steps of:

forming a plurality of memory cells aligned with one another, each of said plurality of memory cells comprising an access transistor and a capacitor, said access transistor selectively connecting a digitline to said capacitor;

forming a first wordline through said plurality of memory cells in alignment with said access transistors of said plurality of memory cells;

forming a second wordline through said plurality of memory cells in alignment with said access transistors of said plurality of memory cells;

forming bifurcated control conductors having first conductors extending from said first wordline toward control elements of said access transistors and second conductors extending from said second wordline toward control elements of said access transistors;

connecting said first conductors of said bifurcated control conductors of alternating ones of said plurality of memory cells to said control elements for said access transistors; and connecting said second conductors of said bifurcated control conductors of remaining ones of said plurality of memory cells to said control elements for said access transistors.

4. A method of making a semiconductor memory comprising the steps of:

forming a plurality of memory cell pairs aligned with one another, each of said plurality of memory cell pairs comprising first and second access transistors and first and second capacitors, said first access transistor selectively connecting a digitline to said first capacitor and said second access transistor selectively connecting said digitline to said second capacitor;

forming a first wordline through said plurality of memory cell pairs in alignment with said first access transistors of said plurality of memory cell pairs;

forming a second wordline through said plurality of memory cell pairs in alignment with said first access transistors of said plurality of memory cell pairs;

forming a third wordline through said plurality of memory cell pairs in alignment with said second access transistors of said plurality of memory cell pairs;

forming a fourth wordline through said plurality of memory cell pairs in alignment with said second access transistors of said plurality of memory cell pairs;

forming first bifurcated control conductors having first conductors extending from said first wordline toward control elements of said first access transistors and second conductors extending from said second wordline toward control elements of said first access transistors;

forming second bifurcated control conductors having third conductors extending from said third wordline toward control elements of said second access transistors and fourth conductors extending from said fourth wordline toward control elements of said second access transistors;

connecting said first conductors of said first bifurcated control conductors of alternating ones of said plurality of memory cell pairs to said control elements for said first access transistors;

connecting said second conductors of said first bifurcated control conductors of remaining ones of said plurality of memory cell pairs to said control elements for said first access transistors;

connecting said third conductors of said second bifurcated control conductors of alternating ones of said plurality of memory cell pairs to said control elements for said second access transistors; and connecting said fourth conductors of said second bifurcated control conductors of remaining ones of said plurality of memory cell pairs to said control elements for said second access transistors.

5. A method of making a semiconductor memory comprising the steps of:

forming a pair of wordlines;

forming a series of aligned transistor stacks, said transistor stacks including and being interconnected by said pair of wordlines;

forming each of said transistor stacks by performing the following steps:
 forming a gate oxide layer;
 forming a polysilicon layer on said gate oxide layer;
 forming an electrically conducting material on said polysilicon layer;
 forming an electrical connection from said electrically conducting layer to a first one of said pair of wordlines in alternating ones of said aligned transistor stacks;
 forming an electrical connection from said electrically conducting layer to a second one of said pair of wordlines in the remaining ones of said aligned transistor stacks, said remaining ones of said aligned transistor stacks being interleaved with said alternating ones of said aligned transistor stacks;

insulating said electrically conducting layer from said second one of said pair of wordlines for said alternating ones of said aligned transistor stacks; and insulating said electrically conducting layer and said first one of said pair of wordlines for said remaining ones of said aligned transistor stacks.

6. A method of making a semiconductor memory comprising the steps of:

forming a substantially linear first wordline;

forming a substantially linear second wordline spaced from said first wordline;

forming a plurality of memory cells aligned with one another along said first and second wordlines, with each of said plurality of memory cells being formed by performing the steps of:
 forming an access transistor; and
 forming a capacitor, said access transistor selectively connecting a digitline to said capacitor;
 forming a first conductor connected to said first wordline and extending toward a control element of said access transistor;
 forming a second conductor connected to said second wordline and extending toward said control element of said access transistor; and forming conductor links connecting said control elements of a first series of alternating ones of said access transistors of said plurality of memory cells to said first conductors and connecting said control elements of a second series of alternating ones of said access transistors of said plurality of memory cells to said second conductors, said second series of alternating ones of said plurality of memory cells being interleaved with said first series of alternating ones of said plurality of memory cells.

7. A method of making a semiconductor memory comprising the steps of:

forming a substantially linear first wordline;

forming a substantially linear second wordline spaced from said first wordline;

forming a substantially linear third wordline spaced from said second wordline;

forming a substantially linear fourth wordline spaced from said third wordline;

forming a plurality of memory cell pairs aligned with one another along said first, second, third and fourth wordlines, each of said memory cell pairs being formed by performing the steps of:
 forming a first access transistor;
 forming a first capacitor, said first access transistor selectively connecting a digitline to said first capacitor;
 forming a second access transistor;
 forming a second capacitor, said second access transistor selectively connecting said digitline to said second capacitor;
 forming a first conductor connected to said first wordline and extending toward a control element of said first access transistor;
 forming a second conductor connected to said second wordline and extending toward said control element of said first access transistor;
 forming a third conductor connected to said third wordline and extending toward a control element of said second access transistor;

forming a fourth conductor connected to said fourth wordline and extending toward said control element of said second access transistor;

forming first conductor links to connect said control elements of said first access transistors of a first series of alternating ones of said plurality of memory cell pairs to said first conductors and to connect said control elements of said first access transistors of a second series of alternating ones of said plurality of memory cell pairs to said second conductors, said second series of alternating ones of said plurality of memory cell pairs being interleaved with said first series of alternating ones of said plurality of memory cell pairs; and forming second conductor links connecting said control elements of said second access transistors of a first series of alternating ones of said plurality of memory cell pairs to said third conductors and connecting said control elements of said second access transistors of a second series of alternating ones of said plurality of memory cell pairs to said fourth conductors, said second series of alternating ones of said plurality of memory cell pairs being interleaved with said first series of alternating ones of said plurality of memory cell pairs.

8. A method of making a semiconductor memory comprising the steps of:

forming a substantially linear first wordline;

forming a substantially linear second wordline spaced from said first wordline;

forming a plurality of memory cells aligned with one another along said first and second wordlines, each of said memory cells being formed by performing the steps of:
  forming an access transistor;
  forming a capacitor, said access transistor selectively connecting a digitline to said capacitor;
  forming a first conductor connected to said first wordline and extending toward a control element of said access transistor;
  forming a second conductor connected to said second wordline and extending toward said control element of said access transistor; and connecting said control elements of said access transistors of a first series of alternating ones of said plurality of memory cells to said first conductors;

connecting said control elements of said access transistors of a second series of alternating ones of said plurality of memory cells to said second conductors, said second series of alternating ones of said plurality of memory cells being interleaved with said first series of alternating ones of said plurality of memory cells;

insulating said control elements of said access transistors and said second conductors of said first series of alternating ones of said plurality of memory cells; and insulating said control elements of said access transistors and said first conductors of said second series of alternating ones of said plurality of memory cells.

9. A method of making a semiconductor memory comprising the steps of:

forming a substantially linear first wordline;

forming a substantially linear second wordline spaced from said first wordline;

forming a substantially linear third wordline spaced from said second wordline;

forming a substantially linear fourth wordline spaced from said third wordline;

forming a plurality of memory cell pairs aligned with one another along said first, second, third and fourth wordlines, each of said memory cell pairs being formed by performing the steps of:
  forming a first access transistor;
  forming a first capacitor, said first access transistor selectively connecting a digitline to said first capacitor;
  forming a second access transistor;
  forming a second capacitor, said second access transistor selectively connecting said digitline to said second capacitor;
  forming a first conductor connected to said first wordline and extending toward a control element of said first access transistor;
  forming a second conductor connected to said second wordline and extending toward said control element of said first access transistor;
  forming a third conductor connected to said third wordline and extending toward a control element of said second access transistor;
  forming a fourth conductor connected to said fourth wordline and extending toward said control element of said second access transistor; and connecting said control elements of said first access transistors of a first series of alternating ones of said plurality of memory cell pairs to said first conductors;

connecting said control elements of said first access transistors of a second series of alternating ones of said plurality of memory cell pairs to said second conductors, said second series of alternating ones of said plurality of memory cell pairs being interleaved with said first series of alternating ones of said plurality of memory cell pairs;

connecting said control elements of said second access transistors of said first series of alternating ones of said plurality of memory cell pairs to said third conductors;

connecting said control elements of said second series of alternating ones of said plurality of memory cell pairs to said fourth conductors;

insulating said control elements of said first access transistors and said second conductors of said first series of alternating ones of said plurality of memory cell pairs;

insulating said control elements of said first access transistors and said first conductors of said second series of alternating ones of said plurality of memory cell pairs;

insulating said control elements of said second access transistors and said fourth conductors of said first series of alternating ones of said plurality of memory cell pairs; and insulating said control elements of said second access transistors and said third conductors of said second series of alternating ones of said plurality of memory cell pairs.

* * * * *

UNITED STATES PATENT AND TRADEMARK OFFICE
CERTIFICATE OF CORRECTION

PATENT NO.    : 6,204,114 B1
DATED         : March 20, 2001
INVENTOR(S)   : Clampitt et al.

Page 1 of 1

It is certified that error appears in the above-identified patent and that said Letters Patent is hereby corrected as shown below:

Column 4,
Line 19, reads "transistors in.that" should read -- transistors in that --

Signed and Sealed this

Sixteenth Day of October, 2001

Attest:

NICHOLAS P. GODICI
Attesting Officer
Acting Director of the United States Patent and Trademark Office